(12) United States Patent
Ouvrier-Buffet et al.

(10) Patent No.: US 7,279,682 B2
(45) Date of Patent: Oct. 9, 2007

(54) DEVICE FOR MAINTAINING AN OBJECT UNDER VACUUM AND METHODS FOR MAKING SAME, USE IN NON-COOLED INFRARED SENSORS

(75) Inventors: Jean-Louis Ouvrier-Buffet, Sevrier (FR); Sylvette Bisotto, Grenoble (FR); Chantal Beccia, Eybens (FR)

(73) Assignee: Commissariat a l'Energie Atomique, Paris (FR)

( * ) Notice: Subject to any disclaimer, the term of this patent is extended or adjusted under 35 U.S.C. 154(b) by 475 days.

(21) Appl. No.: 10/518,384

(22) PCT Filed: Jul. 1, 2003

(86) PCT No.: PCT/FR03/02035

§ 371 (c)(1),
(2), (4) Date: Dec. 29, 2004

(87) PCT Pub. No.: WO2004/006290

PCT Pub. Date: Jan. 15, 2004

(65) Prior Publication Data

US 2005/0211900 A1   Sep. 29, 2005

(30) Foreign Application Priority Data

Jul. 3, 2002   (FR) .................................. 02 08293

(51) Int. Cl.
*G01J 5/00* (2006.01)

(52) U.S. Cl. .................................................. 250/338.1
(58) Field of Classification Search .............. 250/338.1
See application file for complete search history.

(56) References Cited

U.S. PATENT DOCUMENTS

| 5,293,511 | A | | 3/1994 | Poradish et al. |
| 5,317,157 | A | * | 5/1994 | Yoshida et al. ............. 250/352 |
| 5,895,233 | A | | 4/1999 | Higashi et al. |
| 5,921,461 | A | | 7/1999 | Kennedy et al. |

FOREIGN PATENT DOCUMENTS

| FR | 2 816 447 | 5/2002 |
| JP | 53-044190 | 4/1978 |
| JP | 2000-337959 | 12/2000 |

* cited by examiner

*Primary Examiner*—Constantine Hannaher
*Assistant Examiner*—Marcus H Taningco
(74) *Attorney, Agent, or Firm*—Oblon, Spivak, McClelland, Maier & Neustadt, P.C.

(57) ABSTRACT

A device for holding an object under a vacuum and processes for making the device, which may find application to uncooled infrared detectors. In the device, a leak tight cavity that contains the object, and in which the vacuum is created, and a getter designed to trap gases that could be located in the cavity are formed. The getter is placed outside the cavity and is contained in a leak tight housing connected to the cavity through at least one leak tight passage.

12 Claims, 1 Drawing Sheet

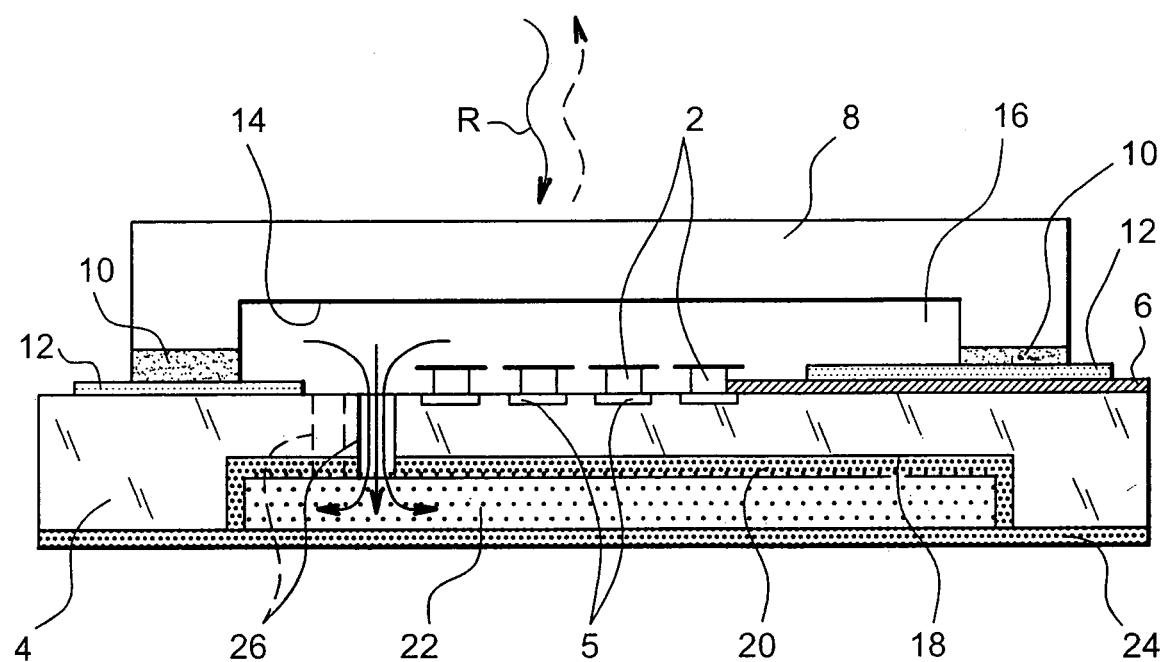

DEVICE FOR MAINTAINING AN OBJECT UNDER VACUUM AND METHODS FOR MAKING SAME, USE IN NON-COOLED INFRARED SENSORS

TECHNICAL DOMAIN

This invention relates to a device for holding an object under a vacuum and processes for making this device.

It is particularly applicable to holding an uncooled infrared detector or a set of detectors under a vacuum.

An uncooled infrared detector generally comprises a sensitive element that can be heated by infrared radiation in band II (3 µm to 5 µm) or in band III (8 µm to 12 µm), characteristic of the temperature and emissivity of observed bodies. The increase in the temperature of the sensitive element introduces a variation of an electrical property of the material from which this sensitive element is made.

For example, the appearance of electrical charges by pyroelectric effect, or a variation in the capacitance due to a change in the dielectric constant, or a variation in the resistance of the material that may be semiconducting or metallic, can be observed.

Efficient operation of an uncooled infrared detector requires that three main conditions are satisfied, related to the material from which the sensitive element is made:

this sensitive element must have a low heat capacity, there must be good thermal insulation between the active layer of this element and the support of this active layer, the first two conditions requiring the use of thin layers, and the sensitivity of the conversion of the temperature rise to an electrical signal must be high.

Monolithic infrared imagers operating at ambient temperature are made by directly connecting a matrix of sensitive elements to a CMOS or CCD type of silicon multiplexing circuit.

A thermal detector may be encapsulated under a vacuum or under a gas that is a poor conductor of heat to increase the performances of this detector. The encapsulation package then includes a transparent window in band III.

It is difficult to make the integration into a classical package or micro-package efficiently, and it is also relatively expensive. Thus, collective encapsulation techniques have also been proposed to overcome these difficulties.

However, these techniques also have limitations that have to be taken into account to reduce costs and extend the life of encapsulating micro-packages.

STATE OF PRIOR ART

In the domain of collective vacuum encapsulation of uncooled infrared detectors, encapsulation techniques are required to significantly improve the detector integration efficiency, while maintaining high performance of these detectors and reducing their cost.

Refer to the following document:

[1] U.S. Pat. No. 5,895,233A, Higashi et al., Integrated silicon vacuum micropackage for infrared devices.

This document discloses collective encapsulation of infrared devices (emitters or detectors) by coupling of a wafer of such devices with a wafer of windows transparent to infrared radiation, in order to make micro-encapsulation under a vacuum or under a gas that is a poor conductor of heat.

The potential advantages of this known technique include the cost and small size. The size is typically limited to the thickness of two silicon wafers.

The connection between the two wafers is preferably made by a weld strip or film that firstly achieves leak tightness and also maintains the separation between the two components of the micro-package that is formed, depending on its thickness.

The welding film is the result of vacuum deposition using the liftoff technique or etching after deposition of the welding material. This film may be derived from a suitably positioned preform.

Materials with a non-excessive degassing ratio have to be used to maintain an acceptable residual pressure inside the micro-package.

However, even with a relatively low degassing ratio, it is useful or even compulsory to introduce a getter material into the micro-package to adsorb gasses emitted by the different surfaces inside the micro-package because the increase in pressure degrades the thermal insulation of micro-bridges that are made in the encapsulated devices.

Consequently, document [1] proposes to introduce films made of barium, vanadium, iron, zirconium or of alloys of these materials into the micro-package, onto the detector or emitter circuit or onto the windows.

To be made active, the temperature of this type of material must be increased for a short period, either by the Joule effect or by a laser beam, but without excessively overheating detector or emitter devices or windows.

It is advantageously suggested that a getter material, more simply called a getter, should be deposited on micro-bridges reserved for this purpose, so as to confine heating solely to this getter material.

However, the use of getters to create and maintain a vacuum, that also needs to be confined to limit possible pollution of sensitive elements such as micro-bridges, increases the surface area of detection (or emission) chips to the detriment of the number of chips per wafer, particularly because it is difficult to activate them efficiently without exceeding the temperature that can be resisted by the detection (or emission) circuit, which is therefore compensated by a larger getter volume or surface area.

Thus, in the technique described in document [1], the getters used take up space and do not allow sufficient miniaturisation.

Typically, the length and width of the cavities described in document [1], are substantially equal and are between a few millimetres and a few tens of millimetres, and the height of these cavities varies from a few micrometres to a few hundred micrometres depending on the case.

These small dimensions make it impossible to use conventional means of incorporating getter material (for example evacuation pip made of metal or glass, containing this material, or filament of this material placed in the micro-package and activated by the Joule effect).

Furthermore, the technique disclosed by document [1] is done individually and is expensive.

PRESENTATION OF THE INVENTION

The purpose of this invention is to overcome the disadvantages resulting from the use of getters in this technique described in document [1].

The invention enables collective integration of getter material into the process for making uncooled infrared detection devices so as to reduce the cost of these devices.

The invention consists of placing the getter material below the read circuit associated with the detectors, so that no space is lost and connecting this material using at least one passage as small as possible, to the cavity in which the vacuum is to be maintained.

The use of the inactive face of the read circuit, commonly called the "back face", enables the use of a manufacturing process with a more attractive production cost.

More generally, this invention proposes a device and processes for making this device, for holding an object under a vacuum in a cavity without taking up too much space in the cavity.

More specifically, this invention relates to a device for holding an object under a vacuum, this device comprising a leak tight cavity that contains the object and in which the vacuum is created, this cavity being delimited by a first support, for which a first face forms the bottom of the cavity, and by a second support that is fixed to this first face so as to be leak tight, the device also comprising a getter designed to trap gases that could be located in the cavity, this device being characterised in that the getter is placed outside the cavity and is contained in a leak tight housing connected to this cavity through at least one leak tight passage, this leak tight passage passing through the first support.

According to a particular embodiment of the device according to the invention, the first face of the first support carries the object.

According to another particular embodiment, the first face of the first support carries the object, the object being an uncooled infrared radiation emitter or receiver, or a set of such emitters or receivers, and the second support is capable of allowing infrared radiation to pass through.

According to one preferred embodiment of the device according to the invention, the housing is formed in a second face of the first support opposite the first face, and the leak tight passage is formed through the first support to connect the housing to the cavity.

Preferably, the housing is hermetically sealed by at least one layer of a leak tight material.

The walls of the housing are preferably covered by at least one layer protecting the first support from the getter.

This protective layer may be made of a material chosen from among SiO, SiN and $Si_3N_4$.

The getter may be made from a material chosen from among titanium, molybdenum, barium, tantalum, zirconium, iron and vanadium.

This invention also relates to a process for making the device according to the invention, in which:
the object is formed on the first face of the first support,
the housing is formed in the second face of this first support,
the getter is formed in this housing,
the getter is hermetically sealed in this housing,
the passage is formed through the first support,
the assembly thus obtained is put under a vacuum,
the second support is fixed to the first face of the first support in a leak tight manner, under a vacuum, and
the getter is activated.

This invention also relates to a process for making the device according to the invention, in which:
the object is formed on the first face of the first support,
the housing is formed in the second face of this first support,
the getter is formed in this housing,
the passage is formed through the first support,
the second support is fixed to the first face of the first support in a leak tight manner, under any type of atmosphere,
the assembly thus obtained is put under a vacuum by pumping through the getter and the passage,
the getter is hermetically sealed in the housing, and
the getter is activated.

This invention also relates to another process for making the device according to the invention, in which the object is a component comprising an uncooled infrared radiation emitter or receiver, or a plurality of such components, the second support allowing infrared radiation to pass, a read circuit being associated with this component or with this plurality of such components and formed on the first support, and in which:
the housing is formed in the second face of the first support,
the read circuit is formed and the getter is formed in the housing during initial steps of formation of the read circuit, these initial steps resisting high temperatures, but before final steps for formation of the read circuit,
the object is formed on the first face of the first support,
the getter is hermetically sealed in the housing,
the passage is formed through the first support,
the assembly thus obtained is put under a vacuum,
the second support is fixed to the first face of the first support in a leak tight manner, under a vacuum, and
the getter is activated.

This invention also relates to another process for making the device according to the invention, in which the object is a component comprising an uncooled infrared radiation emitter or receiver, or a plurality of such components, the second support allowing infrared radiation to pass through, a read circuit being associated with this component or with this plurality of such components and formed on the first support, and in which:
the housing is formed in the second face of the first support,
the read circuit is formed and the getter is formed in the housing during initial steps of formation of the read circuit, these initial steps resisting high temperatures, but before final steps for formation of the read circuit,
the object is formed on the first face of the first support,
the passage is formed through the first support,
the second support is fixed to the first face of the first support in a leak tight manner, under any type of atmosphere,
the assembly thus obtained is put under a vacuum by pumping through the getter and the passage,
the getter is hermetically sealed in the housing, and
the getter is activated.

BRIEF DESCRIPTION OF THE DRAWING

This invention will be better understood after reading the description of example embodiments given below purely for guidance and in no way limitatively, with reference to the single appended FIGURE that is a diagrammatic and partial sectional view of a particular embodiment of the device according to the invention.

DETAILED PRESENTATION OF PARTICULAR EMBODIMENTS

In one example of the invention, it is required to hold a set of components consisting of uncooled infrared detectors or emitters on the active face of a read circuit, under a vacuum.

According to one preferred embodiment of the invention, the face opposite this active face of the read circuit is used to install the getter material.

One or several orifices that are in contact with the getter material and that open up into the cavity in which all components are located, are used to create and/or maintain the vacuum in the cavity.

This concept extends the systematic use of microelectronic techniques on a semiconductor such as silicon, until the cavity is created.

The cavity concept should be understood in the broad sense of the term, since it is possible to consider collective encapsulation of a device composed of detectors and also individual encapsulation of detectors arranged in the form of a matrix.

This approach relates to all dimensions of the vacuum packages. However, it is particularly suitable for very small packages in which it is difficult to introduce and then activate a solid getter close to the device to be encapsulated without damaging this device.

The single appended FIGURE is a diagrammatic sectional view of a vacuum encapsulated object according to the invention.

This object is a set of radiation emitter or detector elements 2, for example microbolometres.

This set is formed on a first face of a semiconducting substrate 4 comprising the read circuit 5 associated with the elements. The sectional view is taken in a plane perpendicular to this read circuit.

This first face, or front face, is provided with metallisations such as the metallisation 6, to electrically connect the read circuit to the set of components.

In addition to the substrate 4, the device used to hold all elements 2 under a vacuum comprises another substrate 8 or window, allowing radiation R to be detected or emitted by elements or components 2, to pass through. This substrate 8 is fixed to the substrate 4 in a leak tight manner, through a sealing bead 10.

More specifically, the substrate 4 comprises an electrically insulating layer 12 that extends on the front face of the substrate 2 around the set of components 2 and above the metallisations, and the sealing bead 10 bears on this insulating layer 12 as can be seen in the attached Figure.

Furthermore, the substrate 8 comprises a recess 14 which, when this substrate 8 is sealed to the substrate 4, defines a cavity 16 containing components 2.

On its back face (opposite its front face), the substrate 4 comprises a recess 18 that extends over approximately the entire area occupied by the cavity 16.

A getter material 22 is placed in the recess 18. One or several barrier layers 20 cover the walls of the recess 18 and are used to protect the component material of the substrate 4 from the getter material 22.

One or several other barrier layers 24 are formed on the back face of the substrate 8 to hermetically seal this getter material 22 in the cavity defined by the recess 18 and this layer 24.

In accordance with the invention, one or several channels 26 pass through the substrate 4 and the barrier layer(s) 20 to create a communication passage between this cavity and the other cavity 16, so as to be able to keep a vacuum in this cavity 16 due to the getter material.

The fact of placing the getter material below the cavity 16 containing the components 2 results in a considerable space saving.

Various processes for making elementary infrared radiation detectors or emitters, for example such as microbolometres, are known and there is no need to mention them again here. However, note that the manufacturing process used for making components 2 is not always compatible with the installation and usage technology of the getter.

Remember that a getter, also called a "gas fixer" is a porous material that can be transported in air; a superficial layer will saturate and block the trapping phenomenon. All that is necessary is to heat this material to a specific temperature so that the impurities trapped at the surface diffuse towards the centre of the material to make the surface operational once again.

In the invention, the surface area of the getter is calculated so that it can "absorb" all impurities that might appear in the cavity containing the device to be kept under a vacuum (in other words the cavity 16 containing the components 2 in the example shown) during operation of this device.

If the getter is saturated after all, all that would be necessary in the limiting case would be to reactivate it by making it sufficiently hot to make the getter efficient once again.

A getter is made from materials that, once activated, capture residual gas molecules. Thus, they adsorb, absorb and/or trap gas molecules emitted by the walls of the cavity during the life of the product to be kept under a vacuum.

Preferred getter materials are titanium, molybdenum, barium, tantalum, zirconium, iron and vanadium.

They are usually in the form of sintered powders or films made by screen printing. The production of such materials then requires annealing at about 800° C. in an ultra-high vacuum furnace.

These materials can also be deposited in thin layers using usual microelectronics techniques such as evaporation and sputtering.

These materials are then activated in situ because they do not encounter other species along their path once they have been ejected from the source or the target into the vacuum. Therefore they need to be perfectly encapsulated to assure that they remain efficient in pumping after being exposed to air.

The getter material 22 in the appended FIGURE is deposited in the corresponding cavity by one of the techniques mentioned above. Beforehand, the semiconducting material of the substrate 4 that supports the read circuit is protected by one or several barrier layers, for example composed of SiO, SiN or $Si_3N_4$ as mentioned above.

Once deposited, and if necessary, the getter material is planarised by techniques known to those skilled in the art, such as mechanical, mechanical-chemical or electrochemical polishing before or after annealing under a vacuum.

Finally, the material is encapsulated by one or several barrier layers in order to definitively protect it from the ambient atmosphere.

Depending on the manufacturing process used, the getter may be integrated on the back face of the substrate on which the read circuit is installed during the front face treatment phase or the back face treatment phase in the process for the assembly.

The back face treatment consists of technological steps that can take place at high temperatures where as the front face can only stand, and only requires heat treatments not exceeding 450° C., for example including the manufacture of uncooled detectors.

Therefore it is essential to judiciously include getter integration steps in the manufacturing process for the assembly in order to obtain high quality getter materials and to avoid damaging components 2 and read circuits.

A vacuum encapsulated thermal detector according to the invention is composed of the micro-package described previously (assembly of the substrates and of the getter) leading to a component with optimised size and cost.

The elements of this detector may have a matrix architecture, that can be used for infrared imagery.

In one preferred embodiment, a manufacturing process according to the invention maintains a collective aspect until the component is terminated, integrated in a vacuum micro-package.

Two substrates are used to make a collective assembly:
 a wafer of uncooled infrared detectors on a silicon read circuit, with a recess being formed on the back of the wafer and then filled with a getter material, and
 a window wafer for infrared radiation (for example made of Si, Ge or ZnS).

These substrates are produced separately in advance, using usual techniques in microelectronics.

Thus, the cavities in the read circuit wafer and in the window wafer are formed by chemical etching processes or plasma etching processes. Similarly, the orifice(s) used to evacuate residual gases to the getter are formed by such processes.

Simply as an example and in no way limitatively, the read circuit wafer is about 500 μm thick, the cavities are between 5 μm and 200 μm deep and the window wafer is between 100 μm and 2 mm thick depending on the nature and size of the detectors.

Metallic materials (for example such as Ti, TiN, Pt, Al, Au, W, Ni, In, Sn, InPb, SnPb) that form the metallic interconnection pads, sealing beads and their sockets, are deposited by cathodic sputtering, chemical vapour deposition or evaporation.

These various metallisations are defined by chemical etching processes or plasma etching processes or a lift off process.

Insulating material layers (for example layers of SiO, SiN or $Si_3N_4$) and/or layers that form a barrier for diffusion, are obtained by thermal decomposition (LPCVD) or plasma decomposition (PECVD). These layers may for example be between 0.05 μm and 5 μm thick.

To obtain N micro-packages, a wafer carrying N read circuits and N sets of elementary detectors on its front face and N cavities containing the getter on its back face is vacuum sealed with a wafer comprising N windows, using the most appropriate technique.

After sealing, cutting out is done twice to separate the N micro-packages:
 a first time to separate the N windows, and
 a second time to separate the N packages.

The getter is activated in situ when sealing is done, before cutting or after cutting, so that when this activation phase is finished, the vacuum level (residual pressure) in the cavity is less than or equal to 1 Pa.

We will again give examples of processes for making the device according to the invention in the appended FIGURE.

In a first example,
 the elements 2 are formed on the front face of the substrate 4,
 the recess 18 provided with the layer 20 is formed in the back face of this substrate 4,
 the getter 22 is formed in this recess,
 the getter is hermetically sealed in the recess by the layer 24,
 the channel(s) 26 is (are) formed through the substrate 4,
 a vacuum is created in the assembly thus obtained,
 the substrate 8 is sealed to the front face of the substrate 4 and
 the getter is activated.

In a second example,
 the elements 2 are formed on the front face of the substrate 4,
 the recess 18 is formed together with layer 28 in the back face of this substrate 4,
 the getter 22 is formed in this recess,
 the channel(s) is (are) formed through the substrate 4,
 the substrate 8 is sealed to the front face of the substrate 4 under any type of atmosphere,
 the assembly thus obtained is put under a vacuum by pumping through the getter 22,
 the getter is hermetically sealed in its recess by the layer 24, and
 the getter is activated.

In a third example,
 the recess 18 is formed provided with the layer 20 in the back face of the substrate 4,
 the read circuit 5 is formed and the getter 22 is formed in the recess during the initial steps in the formation of the read circuit 5, these initial steps resisting high temperatures, but before final (metallisation) steps for formation of the read circuit,
 the elements 2 are formed on the front face of the substrate 4,
 the getter is hermetically sealed in the recess by the layer 24,
 the channel(s) 26 is (are) formed through the substrate 4,
 the assembly thus obtained is put under a vacuum,
 the substrate 8 is sealed to the front face of the substrate 4 and,
 the getter is activated.

In a fourth example,
 the recess 18 is formed provided with the layer 20 in the back face of the substrate 4,
 the read circuit 5 is formed and the getter 22 is formed in the recess during the initial steps in the formation of the read circuit 5, these initial steps resisting high temperatures, but before the final (metallisation) steps for formation of the read circuit,
 the elements 2 are formed on the front face of the substrate 4,
 the channel(s) 26 is (are) formed through the substrate 4,
 the substrate 8 is sealed to the front face of the substrate 4 under any type of atmosphere,
 the assembly thus obtained is put under a vacuum by pumping through the getter 22,
 the getter is hermetically sealed in its recess by the layer 24, and
 the getter is activated.

The getter hermetically sealed in its cavity is activated by heating it to a temperature compatible with the different elements of the device (read circuit, components, sealing bead, etc.).

This invention is not limited to holding uncooled infrared detectors in a vacuum.

Encapsulation according to the invention is beneficial for all radiation detectors and sensors measuring physical magnitudes, and for devices that need a more or less high vacuum to operate.

The invention claimed is:

1. A device for holding an object under a vacuum, comprising:
 a leak tight cavity that contains the object and in which the vacuum is created, the cavity being delimited by a first support, for which a first face forms a bottom of the cavity, and by a second support fixed to the first face so as to be leak tight;

a getter configured to trap gases that could be located in the cavity, wherein the getter is placed outside the cavity and is contained in a leak tight housing connected to the cavity through at least one leak tight passage, the leak tight passage passing through the first support.

2. A device according to claim 1, wherein the first face of the first support carries the object.

3. A device according to claim 1, wherein the first face of the first support carries the object, the object being an uncooled infrared radiation emitter or receiver, or a set of such emitters or receivers, and the second support is configured to allow infrared radiation to pass through.

4. A device according to claim 1, wherein the housing is formed in a second face of the first support opposite the first face, and the leak tight passage is formed through the first support to connect the housing to the cavity.

5. A device according to claim 4, wherein the housing is hermetically sealed by at least one layer of a leak tight material.

6. A device according to claim 4, wherein walls of the housing are covered by at least one layer protecting the first support from the getter.

7. A device according to claim 6, wherein the at least one protecting layer is made of a material chosen from among $SiO$, $SiN$, and $Si_3N_4$.

8. A device according to claim 1, wherein the getter is made from a material chosen from among titanium, molybdenum, barium, tantalum, zirconium, iron, and vanadium.

9. A process for making the device according to claim 1, comprising:
forming the object on the first face of the first support;
forming the housing in the second face of the first support;
forming the getter in the housing;
hermetically sealing the getter in the housing;
forming the passage through the first support;
putting an assembly thus obtained under a vacuum;
fixing the second support to the first face of the first support in a leak tight manner, under a vacuum; and
activating the getter.

10. A process for making the device according to claim 1, comprising:
forming the object on the first face of the first support;
forming the housing in the second face of the first support;
forming the getter in the housing;
forming the passage through the first support;
fixing the second support to the first face of the first support in a leak tight manner, under any type of atmosphere;
putting an assembly thus obtained under a vacuum by pumping through the getter and the passage;
hermetically sealing the getter in the housing; and
activating the getter.

11. A process for making the device according to claim 1, wherein the object is a component comprising an uncooled infrared radiation emitter or receiver, or a plurality of such components, the second support allowing infrared radiation to pass, a read circuit being associated with the component or with the plurality of such components and formed on the first support, the process comprising:
forming the housing in the second face of the first support;
forming the read circuit and the getter in the housing during initial steps of forming the read circuit, the initial steps resisting high temperatures, but before final steps for forming the read circuit;
forming the object on the first face of the first support;
hermetically sealing the getter in the housing;
forming the passage through the first support;
putting an assembly thus obtained under a vacuum;
fixing the second support to the first face of the first support in a leak tight manner, under a vacuum; and
activating the getter.

12. A process for making the device according to claim 1, wherein the object is a component comprising an uncooled infrared radiation emitter or receiver, or a plurality of such components, the second support allowing infrared radiation to pass through, a read circuit being associated with the component or with the plurality of such components and formed on the first support, the process comprising:
forming the housing in the second face of the first support;
forming the read circuit and the getter in the housing during initial steps of forming the read circuit, the initial steps resisting high temperatures, but before final steps for forming the read circuit;
forming the object on the first face of the first support;
forming the passage through the first support;
fixing the second support to the first face of the first support in a leak tight manner, under any type of atmosphere;
putting an assembly thus obtained under a vacuum by pumping through the getter and the passage;
hermetically sealing the getter in the housing; and
activating the getter.

* * * * *